US010175276B2

(12) United States Patent
Fishburn et al.

(10) Patent No.: US 10,175,276 B2
(45) Date of Patent: Jan. 8, 2019

(54) IDENTIFYING AND CATEGORIZING POWER CONSUMPTION WITH DISAGGREGATION

(71) Applicant: Sense Labs, Inc., Cambridge, MA (US)

(72) Inventors: Matthew William Fishburn, Somerville, MA (US); Michael S. Phillips, Belmont, MA (US)

(73) Assignee: Sense Labs, Inc., Cambridge, MA (US)

( * ) Notice: Subject to any disclaimer, the term of this patent is extended or adjusted under 35 U.S.C. 154(b) by 26 days.

(21) Appl. No.: 15/824,174

(22) Filed: Nov. 28, 2017

(65) Prior Publication Data

US 2018/0196094 A1 Jul. 12, 2018

Related U.S. Application Data

(63) Continuation-in-part of application No. 15/466,553, filed on Mar. 22, 2017, which is a continuation of application No. 14/826,432, filed on Aug. 14, 2015, which is a continuation of application No. 14/707,738, filed on May 8, 2015, now Pat. No. 9,152,737, which is a continuation-in-part of
(Continued)

(51) Int. Cl.
*G01R 21/133* (2006.01)

(52) U.S. Cl.
CPC ................. *G01R 21/133* (2013.01)

(58) Field of Classification Search
None
See application file for complete search history.

(56) References Cited

U.S. PATENT DOCUMENTS

| 5,945,993 A | 8/1999 | Fleischmann |
| 6,311,105 B1 | 10/2001 | Budike |

(Continued)

FOREIGN PATENT DOCUMENTS

| JP | 2012016270 A | 1/2012 |
| KR | 1020100111170 A | 10/2010 |

(Continued)

OTHER PUBLICATIONS

U.S. Appl. No. 15/599,466, filed May 19, 2017, Pending.
(Continued)

*Primary Examiner* — Aditya Bhat
(74) *Attorney, Agent, or Firm* — GTC Law Group PC & Affiliates

(57) ABSTRACT

A power monitor in a building processes a power monitoring signal obtained from the power line to the building to identify electrical events corresponding to state changes of devices in the building. The electrical event may be processed with a classifier to determine if the electrical event corresponds to a state change of an identified device from a list of identified devices or corresponds to a state change of an ambiguous device that is not from the list of identified devices. The power monitor may also determine power consumption information about individual identified devices and about groups of devices, such as a group of always on devices, a group of ambiguous devices, and categories of the group of ambiguous devices. Information about state changes of devices and power consumption of individual devices and groups of devices may be transmitted to a user device for presentation to a user.

21 Claims, 10 Drawing Sheets

Related U.S. Application Data application No. 14/554,935, filed on Nov. 26, 2014, now Pat. No. 9,172,623.

(56) References Cited

U.S. PATENT DOCUMENTS

| | | | |
|---|---|---|---|
| 7,085,814 | B1 | 8/2006 | Gandhi et al. |
| 7,353,182 | B1 | 4/2008 | Missinhoun et al. |
| 8,239,073 | B2 | 8/2012 | Fausak et al. |
| 8,674,823 | B1 | 3/2014 | Contario et al. |
| 9,057,746 | B1 * | 6/2015 | Houlette ............... G06Q 50/06 |
| 9,152,737 | B1 | 10/2015 | Micali et al. |
| 9,172,623 | B1 | 10/2015 | Micali et al. |
| 9,443,195 | B2 | 9/2016 | Micali et al. |
| 9,691,030 | B2 | 6/2017 | Micali et al. |
| 9,699,529 | B1 | 7/2017 | Petri et al. |
| 9,739,813 | B2 | 8/2017 | Houlette et al. |
| 9,800,958 | B1 | 10/2017 | Petri et al. |
| 9,942,630 | B1 | 4/2018 | Petri et al. |
| 2002/0178047 | A1 | 11/2002 | Or et al. |
| 2003/0216971 | A1 | 11/2003 | Sick et al. |
| 2004/0142662 | A1 | 7/2004 | Ehrenberg et al. |
| 2004/0255171 | A1 | 12/2004 | Zimmer et al. |
| 2005/0034023 | A1 | 2/2005 | Maturana et al. |
| 2005/0085973 | A1 | 4/2005 | Furem et al. |
| 2005/0108582 | A1 | 5/2005 | Fung et al. |
| 2006/0155514 | A1 | 7/2006 | Drouart et al. |
| 2006/0235574 | A1 | 10/2006 | Lapinski et al. |
| 2008/0306985 | A1 | 12/2008 | Murray et al. |
| 2009/0222360 | A1 | 9/2009 | Schmitt et al. |
| 2010/0211222 | A1 | 8/2010 | Ghosn et al. |
| 2010/0217550 | A1 | 8/2010 | Crabtree et al. |
| 2010/0332373 | A1 | 12/2010 | Crabtree et al. |
| 2011/0066300 | A1 | 3/2011 | Tyagi et al. |
| 2012/0022713 | A1 * | 1/2012 | Deaver, Sr. ............ G05B 17/02 700/298 |
| 2012/0065802 | A1 | 3/2012 | Seeber et al. |
| 2012/0181869 | A1 | 7/2012 | Chapel et al. |
| 2012/0197448 | A1 | 8/2012 | Shin et al. |
| 2012/0197560 | A1 | 8/2012 | Kuhns et al. |
| 2012/0221718 | A1 | 8/2012 | Imes et al. |
| 2012/0239773 | A1 | 9/2012 | Blustein et al. |
| 2012/0278272 | A1 | 11/2012 | Kim et al. |
| 2012/0280833 | A1 | 11/2012 | Jonsson et al. |
| 2012/0290230 | A1 * | 11/2012 | Berges Gonzalez ... G01D 4/004 702/61 |
| 2013/0066479 | A1 | 3/2013 | Shetty et al. |
| 2013/0132009 | A1 | 5/2013 | Rolia et al. |
| 2013/0268357 | A1 | 10/2013 | Heath et al. |
| 2014/0207255 | A1 | 7/2014 | Tandon et al. |
| 2014/0278241 | A1 | 9/2014 | Jiang et al. |
| 2014/0303796 | A1 | 10/2014 | Jeong et al. |
| 2015/0012147 | A1 | 1/2015 | Haghighat-Kashani et al. |
| 2015/0112906 | A1 | 4/2015 | Gauthier et al. |
| 2015/0127185 | A1 | 5/2015 | Behrangrad |
| 2015/0142695 | A1 | 5/2015 | He et al. |
| 2015/0149128 | A1 | 5/2015 | Baone et al. |
| 2015/0161020 | A1 | 6/2015 | Matsuoka et al. |
| 2015/0204558 | A1 | 7/2015 | Sartain et al. |
| 2015/0261944 | A1 | 9/2015 | Pellom et al. |
| 2015/0271557 | A1 | 9/2015 | Tabe |
| 2015/0271575 | A1 | 9/2015 | Asao et al. |
| 2015/0324696 | A1 | 11/2015 | Hirschbold et al. |
| 2016/0093297 | A1 | 3/2016 | Falik et al. |
| 2016/0132772 | A1 | 5/2016 | Little |
| 2016/0146866 | A1 | 5/2016 | Houlette et al. |
| 2016/0147243 | A1 | 5/2016 | Micali et al. |
| 2016/0148099 | A1 | 5/2016 | Micali et al. |
| 2016/0328651 | A1 | 11/2016 | Micali et al. |
| 2017/0086143 | A1 | 3/2017 | Steinhauer et al. |
| 2017/0176502 | A1 | 6/2017 | Saneyoshi et al. |
| 2017/0176503 | A1 | 6/2017 | Saneyoshi et al. |
| 2017/0192042 | A1 | 7/2017 | Micali et al. |

FOREIGN PATENT DOCUMENTS

| | | |
|---|---|---|
| KR | 101448683 B1 | 10/2014 |
| WO | 2013106923 A1 | 7/2013 |
| WO | 2016085500 A1 | 6/2016 |
| WO | 2016085942 A1 | 6/2016 |

OTHER PUBLICATIONS

"Chapter 8. Remote OS Detection", Nmap Network Scanning, https://nmap.org/book/osdetect.html (accessed Mar. 13, 2017), 6 pages.

"DC Electric Power", http://hyperphysics.phy-astr.gsu.edu/hbase/electric/elepow.html, (accessed on Aug. 5, 2016), 1 Page.

"Host Discovery, Chapter 15. Nmap Reference Guide", Nmap Network Scanning, https://nmap.org/book/man-host-discovery.html (accessed Mar. 13, 2017), 9 pages.

"Simple Service Discovery Protocol", Wikipedia, https://en.wikipedia.org/wiki/Simple_Service_Discovery_Protocol (accessed on Mar. 13, 2017), 3 pages.

Alles, et al., "A Commercial Disaggregation System for Residential and Light Commercial Buildings", Presented on Jun. 3, 2014 at the NILM Workshop 2014, University of Texas at Austin, http://nilmworkshop14.files.wordpress.com/2014/05/alles_commercial.pdf, accessed on Dec. 22, 2014, 4 pages.

Anderson, et al., "Unsupervised Approximate Power Trace Decomposition Algorithm", Presented on Jun. 3, 2014 at the NILM Workshop 2014, University of Texas at Austin, http://nilmworkshop14.files.wordpress.com/2014/05/anderson_unsupervised.pdf, accessed on Dec. 22, 2014, 4 pages.

Armel, et al., "Is Disaggregation the Holy Grail of Energy Efficiency? The Case of Electricity", Precourt Energy Efficiency Center Technical Paper Series: PTP-2012-05-1, Stanford University, http://web.stanford.edu/group/peec/cgi-bin/docs/behavior/research/disaggregation-armel.pdf accpt./publ. in: Energy Policy, 2013, vol. 52, issue C, pp. 213-234, May 1, 2012, 50 pages.

Barker, et al., "NILM Redux: The Case for Emphasizing Applications over Accuracy", Presented on Jun. 3, 2014 at the NILM Workshop 2014, University of Texas at Austin, http://nilmworkshop14.files.wordpress.com/2014/05/barker_nilm.pdf , accessed on Dec. 22, 2014, 4 pages.

Barsim, et al., "An Approach for Unsupervised Non-Intrusive Load Monitoring of Residential Appliances", Presented on Jun. 3, 2014 at the NILM Workshop 2014, University of Texas at Austin, http://nilmworkshop14.files.wordpress.com/2014/05/barsim_approach.pdf , accessed on Dec. 22, 2014, 5 pages.

Batra, et al., "NILMTK: An Open Source Toolkit for Non-intrusive Load Monitoring", Presented on Jun. 3, 2014 at the NILM Workshop 2014, University of Texas at Austin, http://nilmworkshop14.files.wordpress.com/2014/05/batra_nilmtk.pdf , accessed on Dec. 22, 2014, 4 pages.

Bilski, et al., "Analysis of the artificial intelligence methods applicability to the non-intrusive load monitoring", Presented on Jun. 3, 2014 at the NILM Workshop 2014, University of Texas at Austin, http://nilmworkshop14.files.wordpress.com/2014/05/bilski_analysis.pdf , accessed on Dec. 22, 2014, 4 pages.

Brown, et al., "Using Wireless Power Meters to Measure Energy Use of Miscellaneous and Electronic Devices in Buildings", Proceedings of the Energy Efficiency in Domestic Appliances and Lighting (EEDAL) 20001 Conference, Copenhagen, Denmark, May 24-26, 2011, 14 Pages.

Cheshire, et al., "Multicast DNS", Internet Engineering Task Force (IETF), Request for Comments: 6762, Category: Standards Track, ISSN: 2070-1721, Apple, Inc., https://tools.ietf.org/html/rfc6762 (accessed Mar. 13, 2017), Feb. 2013, 140 pages.

Cheshire, "Zero Configuration Networking (Zeroconf)", http://www.zeroconf.org/ (accessed Mar. 13, 2017), 4 pages.

Dong, et al., "Energy Disaggregation via Adaptive Filtering", Presented on Jun. 3, 2014 at the NILM Workshop 2014, University of Texas at Austin, http://nilmworkshop14.files.wordpress.com/2014/05/dong_energy.pdf , accessed on Dec. 22, 2014, 4 pages.

(56) References Cited

OTHER PUBLICATIONS

Figueiredo, et al., "On the Optimization of Appliance Loads Inferred by Probabilistic Models", Presented on Jun. 3, 2014 at the Nilm Workshop 2014, University of Texas at Austin, http://nilmworkshop14.files.wordpress.com/2014/05/figueiredo_optimization.pdf, accessed on Dec. 22, 2014, 4 pages.

Froehlich, et al., "Disaggregated End-Use Energy Sensing for the Smart Grid", Pervasive Computing, IEEE, vol. 10, iss. 1, Jan.-Mar. 2011, pp. 28-39.

Goland, et al., "Simple Service Discovery Protocol/1.0, Operating without an Arbiter, <draft-cai-ssdp-v1-03.txt>", Internet Engineering Task Force, Internet Draft, Microsoft Corporation, Shivaun Albright, Hewlett-Packard Company, https://tools.ietf.org/html/draft-cai-ssdp-v1-03, (accessed on Mar. 13, 2017), Oct. 28, 1999, 36 pages.

Holmegaard, et al., "Towards Automatic Identification of Activity Modes in Electricity Consumption Data for Small and Medium Sized Enterprises", Presented on Jun. 3, 2014 at the NILM Workshop 2014, University of Texas at Austin, http://nilmworkshop14.files.wordpress.com/2014/05/holmegaard_towards.pdf, accessed on Dec. 22, 2014, 4 pages.

Jacquemod, et al., "Innovating current sensor for NILM application", Presented on Jun. 3, 2014 at the NILM Workshop 2014, University of Texas at Austin, http://nilmworkshop14.files.wordpress.com/2014/05/iacquemod_innovating.pdf, accessed Dec. 22, 2014, 4 pages.

Kelly, et al., "Metadata for Energy Disaggregation", Presented on Jun. 3, 2014 at the NILM Workshop 2014, University of Texas at Austin, http://nilmworkshop14.files.wordpress.com/2014/05/kelly_metadata_pdf, accessed on Dec. 22, 2014, 4 pages.

Li, et al., "Energy Disaggregation via Hierarchical Factorial HMM", Presented on Jun. 3, 2014 at the NILM Workshop 2014, University of Texas at Austin, http://nilmworkshop14.files.wordpress.com/2014/05/li_energy.pdf, accessed on Dec. 22, 2014, 4 pages.

Liao, et al., "Power Disaggregation for Low-sampling Rate Data", Presented on Jun. 3, 2014 at the NILM Workshop 2014, University of Texas at Austin, http://nilmworkshop14.files.wordpress.com/2014/05/liao_power.pdf, accessed on Dec. 22, 2014, 4 pages.

Maasoumy, et al., "Handling model uncertainty in model predictive control for energy efficient buildings", Energy and Building, vol. 77, Apr. 1, 2014 (online), pp. 377-392.

Makonin, et al., "Efficient Sparse Matrix Processing for Nonintrusive Load Monitoring (NILM)", Presented on Jun. 3, 2014 at the NILM Workshop 2014, University of Texas at Austin, http://nilmworkshop14.files.wordpress.com/2014/05/makonin_efficient.pdf, accessed on Dec. 22, 2014, 4 pages.

PCT/US2014/067662, "International Application Serial No. PCT/US2014/067662, International Preliminary Report on Patentability and Written Opinion dated Jun. 8, 2017", Sense Labs, Inc., 10 Pages.

PCT/US2014/067662, "International Application Serial No. PCT/US2014/067662, International Search Report and Written Opinion dated Aug. 12, 2015", Sense Labs, Inc., 13 pages.

PCT/US2015/062346, "International Application Serial No. PCT/US2015/062346 International Search Report and Written Opinion dated Feb. 29, 2016", Sense Labs, Inc., 14 pages.

PCT/US2015/062346, "International Application Serial No. PCT/US2015/062346, International Preliminary Report on Patentability and Written Opinion dated Jun. 8, 2017", Sense Labs, Inc., 11 Pages.

Perez, et al., "Nonintrusive Disaggregation of Residential Air-Conditioning Loads from Sub-hourly Smart Meter Data", Presented on Jun. 3, 2014 at the NILM Workshop 2014, University of Texas at Austin, http://nilmworkshop14.files.wordpress.com/2014/05/perez_nonintrusive1.pdf, accessed on Dec. 22, 2014, 4 pages.

Tang, et al., "Semi-Intrusive Load Monitoring for Large-Scale Appliances", Presented on Jun. 3, 2014 at the NILM Workshop 2014, University of Texas at Austin, http://nilmworkshop14.files.wordpress.com/2014/05/tang_semiintrusive.pdf, accessed on Dec. 22, 2014, 4 pages.

Trung, et al., "Event Detection and Disaggregation Algorithms for NIALM System", Presented on Jun. 3, 2014 at the NILM Workshop 2014, University of Texas at Austin, http://nilmworkshop14.files.wordpress.com/2014/05/trung_event.pdf, accessed on Dec. 22, 2014, 4 pages.

Tyler, et al., "Direct, Instantanious Identification of Home Appliances", Presented on Jun. 3, 2014 at the NILM Workshop 2014, University of Texas at Austin, http://nilmworkshop14.files.wordpress.com/2014/05/tyler_direct.pdf, accessed on Dec. 22, 2014, 4 pages.

Zalewski, "p0f v3 (version 3.09b)", http://lcamtuf.coredump.cx/p0f3/ (accessed on Mar. 13, 2017), copyright 2012-2014, 4 pages.

PCT/US18/18897, "International Application Serial No. PCT/US18/18897, International Search Report and Written Opinion dated Mar. 16, 2018", Sense Labs, Inc., 8 Pages.

* cited by examiner

| Device ID | Name | Type | Make | Version | Power Model | Network ID | Network Model | State | Date/Time |
|---|---|---|---|---|---|---|---|---|---|
| 1001 | Dishwasher | Dishwasher | Kenmore | 1000 | Dishwasher-139 | None | None | On | 9/28/2017 8:41 AM |
| 1002 | Refrigerator | Refrigerator | Samsung | RF123 | Refrigerator-86 | 192.168.0.1 | Samsung-1621 | Off | 9/28/2017 10:47 AM |
| 1003 | Living room TV | TV | Toshiba | Regza | TV-894 | 192.168.0.2 | TV-1384 | Sleep | 9/27/2017 10:30 PM |
| ... | | | | | | | | | |

| Device ID | 8:07:01 | 8:07:02 | 8:07:03 | 8:07:04 | 8:07:05 | 8:07:06 | 8:07:07 | 8:07:08 | 8:07:09 | ... |
|---|---|---|---|---|---|---|---|---|---|---|
| 1001 | 0W | 0W | 0W | 0W | 0W | 0W | 0W | 0W | 0W | ... |
| 1002 | 0W | 0W | 0W | 150W | 152W | 158W | 148W | 150W | 150W | ... |
| 1003 | 91W | 91W | 92W | 92W | 91W | 91W | 91W | 91W | 90W | |
| ... | | | | | | | | | | |
| Other | 48W | 50W | 265W | 270W | 281W | 273W | 279W | 277W | 275W | ... |
| Always On | 130W | 130W | 130W | 130W | 130W | 130W | 130W | 130W | 130W | ... |

Fig. 4

| Category | 8:07:01 | 8:07:02 | 8:07:03 | 8:07:04 | 8:07:05 | 8:07:06 | 8:07:07 | 8:07:08 | 8:07:09 | ... |
|---|---|---|---|---|---|---|---|---|---|---|
| Electronics | 48W | 50W | 51W | 50W | 50W | 50W | 51W | 52W | 51W | ... |
| Heating/Cooling | 0W | 0W | 214W | 220W | 231W | 223W | 228W | 225W | 224W | ... |
| Small Appliances | 0W | 0W | 0W | 0W | 0W | 0W | 0W | 0W | 0W | ... |
| ... | | | | | | | | | | |

Fig. 5

Yesterday's Energy Consumption

Identified Devices

| Name | Energy Consumption |
|---|---|
| Dishwasher | 5 kWh |
| Refrigerator | 10 kWh |
| Living room TV | 2 kWh |

Other Devices

| Name | Energy Consumption |
|---|---|
| Heating/Cooling | 30 kWh |
| Small Appliances | 15 kWh |

Total: 62 kWh

Fig. 6

| Device No. | Date/Time | Power Change | State | Category | Features | Statistics |
|---|---|---|---|---|---|---|
| 1 | 9/28/2017 10:32 AM | 57W | On | Heating/ Cooling | feature_blob | statistics_blob |
| 2 | 9/27/2017 11:06 PM | -10W | Off | Small Appliances | feature_blob | statistics_blob |
| ... | | | | | | |

Fig. 11

IDENTIFYING AND CATEGORIZING POWER CONSUMPTION WITH DISAGGREGATION

CROSS-REFERENCE TO RELATED APPLICATIONS

This application is a continuation-in-part of U.S. patent application Ser. No. 15/466,553, filed Mar. 22, 2017.

U.S. patent application Ser. No. 15/466,553 is a continuation of U.S. patent application Ser. No. 14/826,432, filed Aug. 14, 2015.

U.S. patent application Ser. No. 14/826,432 is a continuation of U.S. patent application Ser. No. 14/707,738, filed May 8, 2015, now issued on Oct. 6, 2015, as U.S. Pat. No. 9,152,737.

U.S. patent application Ser. No. 14/707,738 is a continuation-in-part of U.S. patent application Ser. No. 14/554,935, filed Nov. 26, 2014, now issued on Oct. 27, 2015, as U.S. Pat. No. 9,172,623.

BACKGROUND

Reducing electricity or power usage provides the benefits, among others, of saving money by lowering payments to electric companies and also protecting the environment by reducing the amount of resources needed to generate the electricity. Electricity users, such as consumers, businesses, and other entities, may thus desire to reduce their electrical usage to achieve these benefits. Users may be able to more effectively reduce their electricity usage if they have information about what devices (e.g., refrigerator, oven, dishwasher, furnace, and light bulbs) in their homes and buildings are using the most electricity and what actions are available to reduce electricity usage.

Power monitors for individual devices are available for measuring the power usage of a single device. For example, a device can be plugged into a power monitor, and the monitor can in turn be plugged into a wall outlet. These monitors can provide information about power usage for the one device they are attached to, but it may not be practical to monitor all or even many devices in a house or building with these monitors, because it would require a large number of devices that can be expensive and also require significant manual effort to install.

Instead of a power monitor for a single device, a power monitor can be installed at an electrical panel to obtain information about electricity used by many devices simultaneously. A power monitor on an electrical panel is more convenient because a single monitor can provide aggregate usage information about many devices. It is more difficult, however, to extract more specific information about usage of power by a single device, since the monitor typically measures signals that reflect the collective operation of many devices, which may overlap in complex ways. The process of obtaining information about the power usage of a single device from an electrical signal corresponding to usage by many devices may be referred to as disaggregation.

To provide the greatest benefits to end users, a need exists for more accurate disaggregation techniques so that end users receive accurate information about their electrical usage.

BRIEF DESCRIPTION OF THE FIGURES

The invention and the following detailed description of certain embodiments thereof may be understood by reference to the following figures:

FIG. 4 is an example table for storing power consumption information of identified devices and groups of devices.

FIG. 5 is an example table for storing power consumption information for categories of ambiguous devices.

FIG. 6 is an example user interface for presenting a user with information about power consumption of identified devices and categories of ambiguous devices.

FIG. 11 is an example list of ambiguous devices.

DETAILED DESCRIPTION

Figure 1:
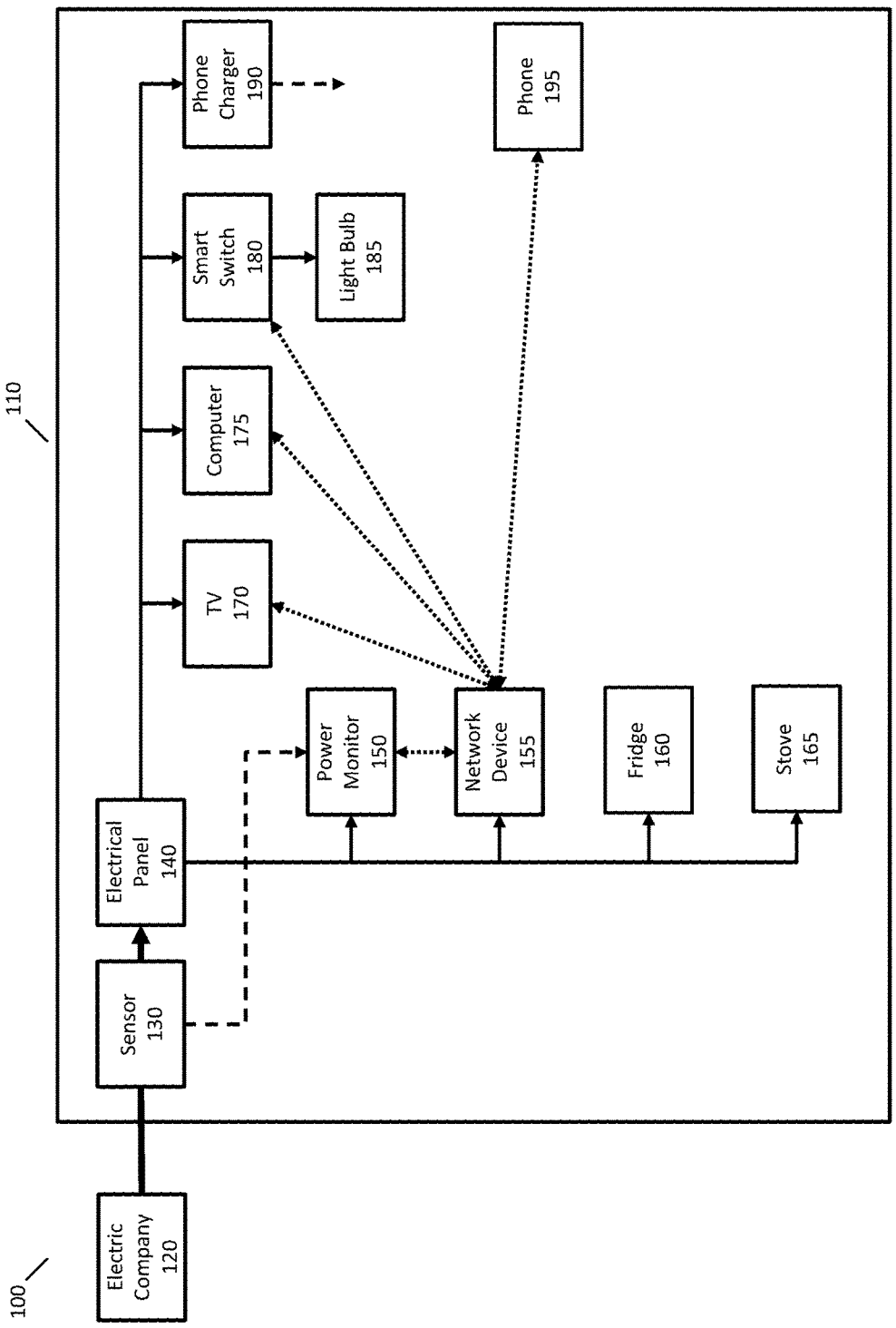
FIG. 1 is an example of a system for determining information about devices in a building using a power monitor.

Described herein are techniques for determining information about devices in a building, such as determining when devices turn on or off or how much power a device is consuming. One source of data in determining information about devices in a building is the power line that provides power to the devices in the building. Electrical sensors may be placed on the power line (or lines) that are providing power to the building, and disaggregation techniques may be used to determine information about individual devices in the building. For example, any of the techniques described in U.S. Pat. No. 9,443,195, which is hereby incorporated by reference in its entirety for all purposes, may be used to determine information about devices using electrical measurements.

Another source of data for determining information about devices in a building is a computer network in the building. A building may have a network, such as a local area network, and devices may connect to the network via a wire (e.g., an Ethernet cable) or wirelessly (e.g., Wi-Fi). A building may have multiple networks, such as local area network coordinated by a wireless router, a mesh network created by other devices working in cooperation (e.g., Sonos speakers), and a personal area network (e.g., a Bluetooth connection between devices). Information about devices on these networks may be obtained, for example, by receiving a service broadcast from a device after it is turned on or by polling a device for information. Any of the techniques described in U.S. Pat. No. 9,699,529, which is hereby incorporated by reference in its entirety for all purposes, may be used to determine information about devices using network transmissions.

The characteristics of some devices may make it more difficult to determine information about them than other devices. For example, some devices may have greater variability in their electrical operation such that it is more challenging to construct a model that reliably distinguishes the device from other devices. For another example, some devices may have electrical characteristics that are similar to another type of device or to many other types of devices. For these devices, which are referred to as ambiguous devices, it may be desired to present some information about the devices rather than to present no information at all. For example, it may be possible to determine a category of the device, such as that the device is a small appliance or corresponds to lighting.

A service may be provided to users to inform them about devices in the building. A company may provide a power monitoring device (a power monitor) that may be installed in the building and connected to the power line and/or the computer network of the building. The power monitor may determine information about individual devices, such as the type of device, state changes of the device, and power usage of the device. For other devices, the power monitor may instead provide less detailed information, such as a category of the device and power consumption of different categories. This information may then be made available to the user, such as by presenting it in a specialized app (e.g., on a smartphone) or a web page.

For clarity of presentation, the techniques described herein will use a house or home as an example of a building where the techniques may be applied, but the techniques described herein are equally applicable to any environment where electricity is used, including but not limited to businesses and commercial buildings, government buildings, and other venues. References to homes throughout should be understood to encompass such other venues.

Power and Network Monitoring

FIG. 1 illustrates an example of a system 100 where information obtained from a power line may be used to determine information about devices in a home. In FIG. 1, electric company 120 provides electrical power to home 110. The electrical power is transmitted to an electrical panel 140 where it may then be distributed to different electrical circuits in the house.

Electrical panel 140 may be any electrical panel that may be found in a building. For example, electrical panel 140 may implement split-phase electric power, where a 240 volt AC electrical signal is converted with a split-phase transformer to a three-wire distribution with a single ground and two mains (or legs) that each provide 120 volts. Some devices in the house may use one of the two mains to obtain 120 volts; other devices in the house may use the other main to obtain 120 volts; and yet other devices may use both mains simultaneously to obtain 240 volts.

Any type of electrical panel may be used, and the techniques described herein are not limited to a split phase electrical panel. For example, electrical panel 140 may be single phase, two phase, or three phase. The techniques are also not limited to the number of mains provided by electrical panel 140. In the discussion below, electrical panel 140 will be described as having two mains, but any number of mains may be used, including just a single main. Other voltage standards, such as for other countries or continents, are intended to be encompassed herein as would be understood by one of ordinary skill in the art.

FIG. 1 illustrates devices that are consuming electricity provided by electrical panel 140. For example, power monitor 150, refrigerator 160, and stove 165 may consume electricity provided via electrical panel 140.

Power monitor 150 may be connected to sensor 130 to measure electrical properties of the electrical line connected to house 110. For example, sensor 130 may measure voltage and/or current levels for electrical lines providing electricity to electrical panel 140. The measurements may be obtained using any available sensors, and the techniques are not limited to any particular sensors or any particular types of values that may be obtained from sensors. Sensor 130 may comprise multiple sensors, such as one or more sensors for each main.

Sensor 130 may provide one or more power monitoring signals to power monitor 150, such as a measurement of current and/or voltage for each main connected to electrical panel 140. Power monitor 150 may process the power monitoring signals to disaggregate them or to obtain information about individual devices in the home. For example, power monitor 150 may determine state changes of devices, such as the television was turned on at 8:30 pm or the compressor of the refrigerator started at 10:35 am and 11:01 am.

Power monitor 150 may be a device that is obtained separately from electrical panel 140 and installed by a user or electrician to connect to electrical panel 140. Power monitor 150 may be part of electrical panel 140 and installed by the manufacturer of electrical panel 140. Power monitor 150 may also be part of (e.g., integrated with or into) an electrical meter, such as one provided by the electric company, and sometimes referred to as a smart meter.

Power monitor 150 may use any appropriate techniques for performing disaggregation or determining information about the power usage or state of individual devices from the power monitoring signal. Power monitor 150 may use any of the techniques described in U.S. Pat. No. 9,443,195.

In some implementations, power monitor 150 may be connected to a computer network in the house. For example, power monitor 150 may have a wired connection to a router in the house (e.g., LAN Ethernet), may have a wireless connection to a network (e.g., Wi-Fi), or may have direct network connections with other devices (e.g., Bluetooth). In these implementations, power monitor 150 is also a network monitor, but for clarity of presentation, the following description will continue to use the term power monitor.

In the example of FIG. 1, power monitor 150 has a network connection with network device 155, which may be any device that facilitates a network in the house, such as a modem, router, or hub. Other devices in the house may also be connected to network device 155. For example, a television 170 (e.g., a smart television), computer 175 (e.g., a personal computer), smart switch 180 (e.g., a Phillips Hue or Belkin Wemo switch), and a phone 195 (e.g., an Android phone or iPhone) may also be connected to the home network. Power monitor 150 may connect to other devices in the house using any appropriate wired or wireless network configuration, such as LAN Ethernet or direct connections with other devices. In some implementations, power monitor 150 may communicate on multiple networks simultaneously (e.g., a Wi-Fi connection to a home router and a Bluetooth connection to a specific device).

Power monitor 150 may learn about devices in the house using data transmitted over the computer network. For example, power monitor 150 may listen for broadcast messages from other devices, may poll other devices, or may listen for network data generated by other devices. In some implementations, a device in the house may transmit data that includes information about the device itself (e.g., a broadcast message or response to poll). For example, a network transmission may include any of the following: a state (e.g., device just turned on or will be turning off), services offered by the device, a user assigned name (e.g., "John's Mac"), a make, a hardware version, a software version, a network address (e.g., an IP address), an identification number (e.g., a MAC address, a device serial number, a universally unique identifier, a globally unique identifier, or a temporary identifier), or other information (e.g., protocol-specific identification (such as a Zeroconf service name) or a resource locator used with the SSDP protocol). Power monitor 150 may use any of the techniques described in U.S. Pat. No. 9,699,529.

Some devices receive power from electrical panel 140 and are not connected to the network (e.g., refrigerator 160, stove 165, and light bulb 185). Some devices receive power from electrical panel 140 and are connected to the network (e.g., power monitor 150, network device 310, smart television 170, computer 175, and smart switch 180). Some devices may be connected to the network but not receive power from electrical panel 140 or only sometimes receive power from electrical panel (e.g., phone 195 that may be charged with phone charger 190).

By using both power monitoring and network monitoring cooperatively or simultaneously, the performance of identifying device activity may be improved, such as by using techniques described in U.S. Pat. No. 9,699,529. For some devices in the home, however, either one or both of power monitoring and network monitoring may be inaccurate or have higher error rates than desired when determining device activity.

Monitoring Services

Figures 2, 3:
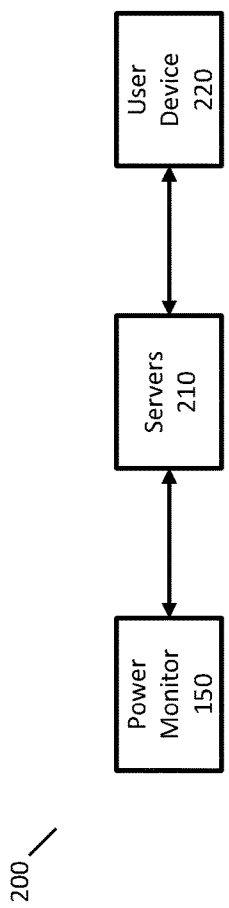
FIG. 2 is an example of a system for providing users with information about devices in a building.
FIG. 3 is an example list of identified devices.

FIG. 2 illustrates a system 200 for providing users with information about devices in their home using one or both of power monitoring and network monitoring. In FIG. 2, power monitor 150 may have any of the functionality described herein. For example, power monitor 150, may identify the existence of devices in the house, may determine states of devices in the house, and may determine power consumption of devices in the house. Power monitor 150 may transmit the information about devices in the home to servers 210 using any known networking techniques. For example, power monitor 150 may have a wireless connection to a router, which in turn connects to servers 210.

Servers 210 may process the information received from power monitor 150 and present information to users, such as through user device 220. Servers 210 may maintain a device list for devices in the home and update the device list with newly identified devices or updated information about devices. Servers 210 may further record a log of device state changes, record a history of power consumption of the house and individual devices, and perform any of the other operations described in U.S. Pat. No. 9,443,195.

A user may obtain information about devices in the house using user device 220. User device 220 may be any device that provides information to a user including but not limited to phones, tablets, desktop computers, and wearable devices. User device 220 may present, for example, information about device state changes and real-time power consumption to the user. For example, user device 220 may present a web page to the user or a special-purpose app may be installed on user device 220. The information presented by user device 220 may include any of the information described in U.S. Pat. No. 9,443,195.

To provide information to users about devices in a home, a list of identified devices in the home may be maintained. FIG. 3 is an example identified device list. The list of identified devices may include any information relating to devices in the home, including but not limited to a device ID (which may be particular to the home or all devices known by a company providing the service), a name (e.g., a user supplied name), a type, a make, a version, one or more power models that are used to identify state changes of the device, a network ID (e.g., a network address or other identifier, such as a MAC address), and one or more network models that are used to identify state changes of the device, and a state of the device.

A device list may be stored in one or more locations. For example, a device list may be stored at one or more of power monitor 150, servers 210, or on user device 220. Different versions of the device list may be stored in different locations corresponding to the processing at the location. For example, power monitor 150 may not store the name, type, make, or version of the devices because this information may not be needed to determine device state changes. User device 220 may not store information about power models and network models because user device 220 may not determine any device state changes.

Energy Consumption Monitoring

Power monitor 150 may monitor the power consumption of individual devices in the house and also provide power consumption information about groups of devices. The devices in the house may be assigned to one or more groups.

A first group of devices may be referred to as identified devices. An identified device is a device in the building that has been identified at some level (e.g., a dishwasher or a motor), has been added to a list of devices for the house, and for which models have been assigned to determine information about the device. An identified device may appear in the identified device list of FIG. 3, and FIG. 3 shows examples of three identified devices. The models used to monitor an identified device may include one or both of power models and network models.

A second group of devices may be referred to as always-on devices. An always-on device may be a device that is nearly always consuming power and whose power consumption characteristics do not change significantly over time. Examples of always-on devices may include a clock or computer networking equipment, such as a modem or router. Because always-on devices do not change state (or do not change state frequently), a power monitor may not have power or network models relating to always-on devices and may not be able to determine power consumption information for individual always-on devices.

A third group of devices may be referred to as ambiguous devices. An ambiguous device is a device that is less amenable to monitoring than the identified devices. A device may be placed into the ambiguous group for a variety of reasons, such as (i) models are able to determine state changes or power consumption of the device, but no information is known about the device (i.e., we have no idea what the device is); (ii) models are not available that are able to reliably determine at least one of state changes or power consumption of the device (e.g., because there is a lot of volatility in the electrical characteristics of the device or because the device has similar electrical characteristics to many other devices), (iii) models are available to reliably determine state changes or power consumption of the device but the model is either too computationally intensive or is not able to provide real-time information, or (iv) models are available to reliably determine state changes or power consumption of the device but we cannot distinguish it from other similar devices (e.g., we can determine that a 60 W light bulb turned but we have no idea which 60 W light bulb turned on). In some implementations, ambiguous devices may be referred to as "other" devices because ambiguous devices generally refer to devices in the house that are different from the identified devices. In some implementations, the always-on devices may be included in the group of ambiguous devices.

The group for a device may depend on a particular implementation and may be fluid. For example, the determination of information about a device may be 80% reliable (according to some standard or measure). In some implementations, this reliability may be sufficient to assign the device to the identified devices group and in some implementations this reliability is insufficient and the device may be assigned to the ambiguous devices group.

Over time, a device may be moved from the ambiguous group to the known group. For example, as time goes on, more data may be collected from a device in the ambiguous group and this additional data may be used to train a new model for an ambiguous device. This new model for the ambiguous device may allow the device to be reliably identified or allow a reliable determination of state changes and/or power consumption. Where the new model has sufficient reliability, the ambiguous device may become an identified device and added to the identified device list for the house.

A power monitor may determine power or energy consumption of devices over time. For example, a power monitor may process a power monitoring signal and determine an amount or power or energy consumption for different devices or groups of devices during a sequence of time intervals, such as every second. The power consumption during a time interval may be an average (or some other statistic) power consumption during the time interval. The power consumption may also be recorded as a total amount of energy consumed during the time period, and these two methods of monitoring power consumption may be used interchangeably.

A power monitor may determine power consumption over a sequence of time intervals for each of the identified devices. FIG. 4 is an example table showing recording power consumption for the three identified devices listed in FIG. 3. The first column of FIG. 4 lists individual identified devices, a group of other devices (e.g., ambiguous devices), and a group of always-on devices. The top row shows time intervals with a duration of one second. For example, the device with device ID 1001 is a dishwasher, and the dishwasher was not used during the time intervals shown in FIG. 4. The device with device ID 1002 is a refrigerator, and the refrigerator started consuming energy during the 8:07:04 interval with an average power consumption of 150 W during the interval.

A power monitor may also determine power consumption during the time intervals for the group of always-on devices. For example, in FIG. 4, the always-on devices are consuming an average of 130 W during each of the time intervals.

A power monitor may also determine a total amount of power consumption during the time intervals for the "other" devices or the group of ambiguous devices. For example, in some implementations, an amount of power consumed by the other devices may be determined by (1) determining power consumption for the building, (2) subtracting the power consumption of each of the identified devices, and (3) subtracting the power consumption of the always-on devices.

The power consumption information for each of the identified devices, the group of always-on devices, and the group of other devices may be transmitted to a user device to inform the user about the power consumption of the house. It may also be desired to prevent the user with additional information about the group of other devices. For example, during time interval 8:07:05, the group of other devices is consuming more energy than any of the identified devices, and it may be helpful for a user to understand more about the power consumption of the group of other devices.

Further information may be provided to the user about the power consumption of the other group of devices. In some implementations, the power consumption of the group of other devices may be broken down into categories that provide the user with more insight into the power consumption of the other group. For example, it may not be possible to determine information about individual devices in the other group, but it may be possible to attribute the power consumption to categories of devices. The power consumption of the other group may be attributed to categories of devices, such as lighting, electronics, heating/cooling, laundry, kitchen, cooking, refrigerators/freezers, pumps, small appliances, or electric vehicles.

In some implementations, information about individual devices in the other group may be presented to the user but may be presented in a different way or at a different time. For example, for some devices in the other group it may be possible to determine information about state changes in power consumption, but it may not be possible to determine this information in real-time. Accordingly, for identified devices, information may be presented in real time about state changes and power consumption, but for some devices in the other group, information about state changes and power consumption may be presented at less frequent intervals, such as on a daily basis.

When attributing the power consumption of the other group into categories, details of individual devices of the other group may not be known. For example, for the electronics category, it may not be known what kind of electronic devices caused the power consumption, how many electrical devices are causing the power consumption, or when any individual device started or stopped consuming electricity. In some implementations, described in greater detail below, soft decisions may be performed in attributing the power consumption of the other group into the categories. For example, for a portion of power consumption, it may be 80% likely that the power consumption corresponds to electronics and 20% likely that the power consumption corresponds to small appliances, and this portion of the power consumption may be divided between the two categories.

FIG. 5 illustrates an example of attributing the power consumption of the other group into categories of devices. In the example of FIG. 5, three categories are shown and the power consumption is determined over the same time intervals as FIG. 4. In some implementations, the power consumption for the categories of devices may be determined over different time intervals, such as per minute or hour. In FIG. 5, the sum of the power consumption of the categories is equal to the energy consumption of the other group, but in some implementations, the attribution to the categories may be approximate instead of exact.

FIG. 6 illustrates an example user interface for presenting information about power consumption to a user. In this example, the power consumption is shown for the previous day, but any appropriate time period may be used. In some implementations, a graph of power consumption over time may be shown. For example, a real-time graph of power consumption of identified devices may be shown or a graph of daily power consumption over the previous month may be shown. Any appropriate user interface and controls may be presented to allow the user to view power consumption for specific time periods or to view a graph of power consumption over specific time periods. In the example of FIG. 6, a first portion of the user interface shows power consumption of three identified devices, a second portion of the interface shows a breakdown of the power consumption of the other group of devices into two categories, and a third portion of the user interface shows a total amount of power consumed.

Techniques are now described for determining power consumption of identified devices, a group of ambiguous devices (or other devices), a group of always-on devices, and categories of ambiguous devices.

Classifying Device State Changes

At a high level, power monitor 150 determines information about devices in the home by obtaining a power monitoring signal from electrical sensors, identifying electrical events in the power monitoring signal corresponding to state changes of devices, classifying the electrical events to determine the device state change that caused the electrical event, and determining power consumption information for individual devices and groups of devices. These aspects of power monitor processing are now described in greater detail.

Power monitor 150 may obtain sensor readings from sensor 130 and perform analog and/or digital signal processing on the sensor readings to obtain one or more power monitoring signals (e.g., a power monitoring signal for each main). For example, power monitor 150 may perform operations such as filtering to certain frequency bands, performing dynamic range compression, sampling, quantization, noise reduction, or synchronization.

Power monitor may then identify electrical events in the power monitoring signal. Electrical events include any changes to a power monitoring signal that are caused by a state change of a device. For example, an electrical event can correspond to manual operation of a device (such as a user turning on or off a device), automatic operation of a device (such as the dishwasher starting a pump as part of its operating cycle), a failure in the operation of a device (such as a failure of the dishwasher pump), a change in the mode of operation of a device (such as a vacuum cleaner switching from "rug" to "wood floor" mode), a change in operating level of a device (such as an oven increasing in cooking temperature), a change in the amount of electrical power used by a device (such as a change in electrical usage in response to a heating or cooling of a component), or other device-related electrical events.

Figure 7:
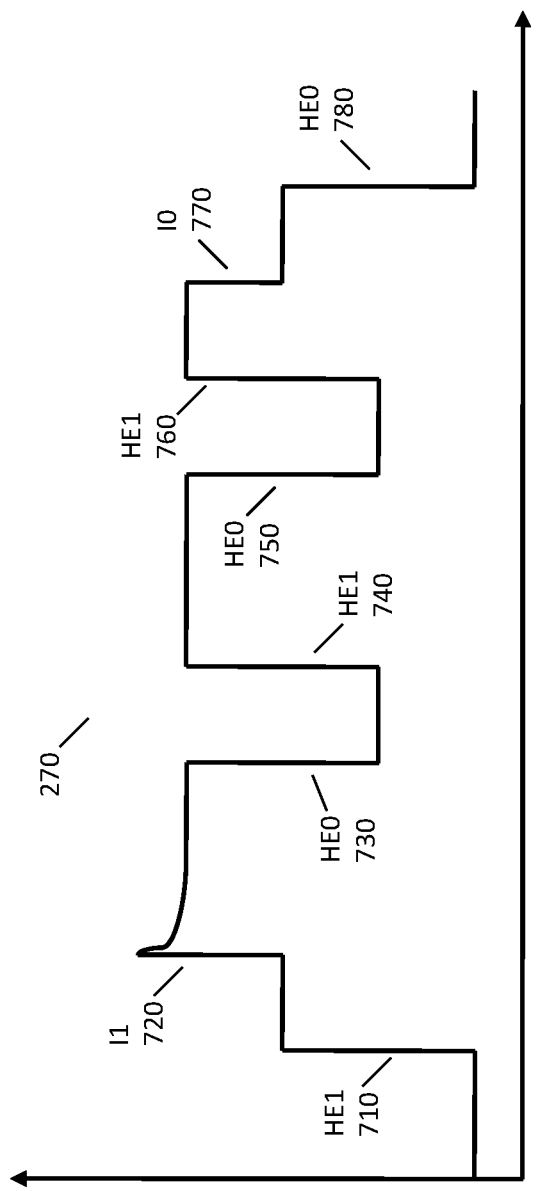
FIG. 7 is an example power monitoring signal.

FIG. 7 illustrates an example of a hypothetical power monitoring signal 700 with electrical events that may be processed by power monitor 150. FIG. 7 illustrates changes to the power monitoring signal caused by state changes of two devices, a stove and an incandescent light bulb. In FIG. 7, the electrical events labelled with HE1 correspond to a heating element of the burner of a stove being turned on and the electrical events labelled with HE0 correspond to a heating element of the burner being turned off (for electric stoves, the burner may appear to be on to the user, but the stove may cause the heating element to turn on and off on a periodic basis to maintain a desired temperature). The electrical event labelled with I1 corresponds to an incandescent light bulb being turned on and the electrical event labelled I0 corresponds to the incandescent light bulb being turned off.

At electrical event 710, a burner of a stove is turned on and the heating element of the burner consumes electricity. Accordingly, the power usage increases in the power monitoring signal. While the heating element is on, at electrical event 720, the incandescent light bulb is turned on to further increase the power usage. At electrical events 730, 740, 750, and 760, the heating element is turned off, then on, then off, and then on again. At electrical event 770, the incandescent light bulb is turned off, and at electrical event 780, the burner of the stove is turned off and the heating element stops consuming electricity.

Power monitor 150 may detect electrical events using any classification techniques known to one of skill in the art. In some implementations, a classifier may be trained using machine learning techniques, such as by processing data that is already labeled or classified by event type. In some implementations, power monitoring signals may be obtained from houses, and specific electrical events in the signals may be labeled automatically, semi-automatically, or manually. With this data, one or more classifiers may be trained to automatically recognize electrical events. The classifiers may include, but are not limited to, neural networks, self-organizing maps, support vector machines, decision trees, random forests, and Gaussian mixture models. The input to the classifiers may be power monitoring signals or features computed from power monitoring signals.

In some implementations, power monitor 150 may detect electrical events by looking for changes in the values of a power monitoring signal. For example, a simple change of value of a power monitoring signal greater than a threshold (volt, amp, watt, etc.) may indicate an electrical event. Changes in values over time (including rates of change and time-derivatives thereof) are also potentially relevant indicators of electrical events.

In some implementations, electrical event detection is performed once per cycle (e.g., at a frequency of 60 Hz on a typical line). For each cycle, a window before and after a given cycle may be used to identify electrical events. A value may be computed for each of the before and after windows and the change (the change may additive, multiplicative, or other measure of change) in value may be compared to a threshold.

Each of the electrical events may be associated with a time or times. For example, a time may correspond to the approximate time of the commencement of the electrical event, to an approximate mid-point of the electrical event, or to starting and ending points of the electrical event. More generally, electrical events may also be associated with a start time, an end time, a duration, and a time that the electrical event was recognized.

After detecting an electrical event, power monitor 150 may compute features corresponding to electrical events, such as by processing a portion of the power monitoring signal. The features may be useful in subsequent processing for determining information about devices from the electrical events. These features may include some of the features used to detect the electrical event itself and may also include other features that were not used to detect the electrical event but which may be useful for the subsequent processing. The techniques described herein in are not limited to any particular features, and any features known to one of skill in the art may be used.

In some implementations, multiple features may be computed from an electrical event, e.g., approximately 500 features, including but not limited to features relating to comparing power levels (e.g., average, median, maximum, minimum, or logarithmic of the foregoing) in a time period before an event to a time period after the event; a shape of an onset (average power of onset, peak height of an onset, power change over an onset); a value (e.g., average, median, maximum, or minimum) over one or more time periods; change in real or imaginary components of a spectrum (including at multiple harmonics) over two different time periods; matching a sinusoid; a maximum slope; a phase shift; a variability between cycles over a time period; a slope, error, or offset of an exponential decay; a slope or duration of a startup surge; a value (e.g., average, median, maximum, or minimum, or logarithmic of the foregoing) of a startup surge over a time period; ratio of a peak height of startup surge to a minimum value after a startup surge; a phase offset change at frequency values or bands over two time periods; harmonic values; total magnitude of harmonic values; harmonic values relative to total magnitude of harmonics; and onset time differences between mains. These features may be computed for any of the types of power monitoring signals described above, including but not limited to current, voltage, and power signals.

Features may be transformed either individually or in combination before further processing. As an example of an individual feature transformation, the logarithm of a wattage measurement might be used instead of or in addition to the wattage measurement itself. As an example of a combination transformation, a power monitoring signal could be decomposed into a set of Fourier coefficients or a wavelet decomposition. Furthermore, a subset of the features may be transformed using techniques such as linear and quadratic discriminants and principal components. Features may also be derived from the pattern of event timing (for example, the number of events occurring in the past 5 seconds or a particular sequence of events, such as a voltage spike followed by steady-state current draw) or by adding features associated with one event with another event occurring before or afterwards.

Different features for the same electrical event may be computed at different times. For example, some features may require a short window of the power monitoring signal around the electrical event and can be computed shortly after the electrical event is detected. Other features may require a longer window around the electrical event and may not be computable until additional portions of the power monitoring signal are received.

Figure 8:
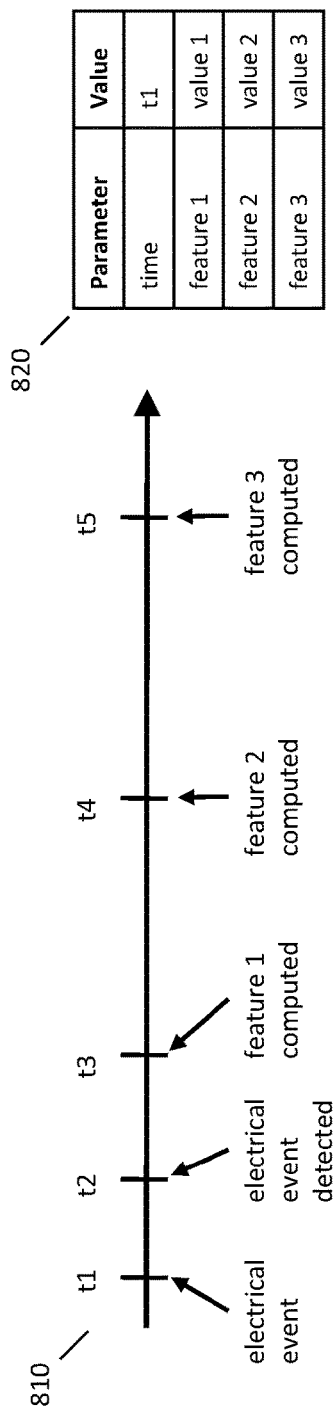
FIG. 8 is an example timeline of computing features from an electrical event and a data structure for storing the features.

For example, a first feature may require a 10 millisecond window of the power monitoring signal, a second feature may require a 0.5 second window of the power monitoring signal, and a third feature may require a 5 second window of the power monitoring signal. FIG. 8 illustrates an example timeline 810 for the occurrence of an electrical event, detection of the electrical event, and computation of features of the electrical event. FIG. 8 also illustrates an example data structure 820 of an electrical event. In FIG. 8, an electrical event occurs at time t1. As described above, the electrical event may be detected at time t2. After the electrical event is detected, data structure 820 may be created for the electrical event and the time of the electrical event may be added to the data structure. Note that at this point in the process, features may not yet have been computed and the values of the features may not yet be present in data structure 820. At time t3, power monitor 150 may have received enough of the electrical signal to compute feature 1 and then add value 1 to data structure 820. Similarly, at time t4, power monitor 150 may generate feature 2 and add value 2 to data structure 820, and at time t5, generate feature 3 and add value 3 to data structure 820.

Downstream processing of the electrical event may decide to process the electrical event before all features have been computed. For example, if it is desired to determine an outcome quickly, the electrical event may be processed after feature 1 is computed, even though not all possible information is available. If it is desired to have the most accurate outcome, downstream processing may not occur until all features of the electrical event have been computed. In other implementations, the electrical event may be processed and classification updated each time a new feature is computed.

Power monitor may use different types of mathematical models or classifiers to determine information about electrical events. One example of a model is a transition model that describes changes to a power monitoring signal caused by a state change of a device. State changes of a device may also include state changes for particular elements of the device, such as a pump in a dishwasher turning on during the washing cycle, a light inside a refrigerator, a heating element or fan in an oven.

Transition models may be created at different levels of specificity. At the highest level, transition models may be created for classes of devices or classes of elements, such as an incandescent light, a fluorescent light, an LED light, a dishwasher, a dishwasher with one pump, or a dishwasher with two pumps. Transition models may further be created for classes of devices by a particular manufacturer (e.g., all dishwashers by a particular manufacturer may have common features). Transition models may further be created for a specific version of a device by a specific manufacturer (e.g., Kenmore 1000 dishwasher). Transition models may even further be created for a specific device (e.g., the Kenmore 1000 dishwasher at 100 Main Street). In common usage, the "1000" in a Kenmore 1000 dishwasher may be referred to as a "model" of the dishwasher, but to avoid confusion with mathematical models, the "model" of a dishwasher will instead be referred to as a "version."

Some devices may have two states, such as an off state and an on state. For these devices, a transition model may be created for transitioning from the off state to the on state and vice versa. For a device with more than two states (e.g., "off, "low speed," and "high speed"), a transition model may be created for each allowed state change.

Transition models may be created using any appropriate techniques. In some implementations, transition models may be created with labeled training data. The training data may comprise electrical events extracted from power monitoring signals taken from houses, which are then labeled as corresponding to a device and according the begin state and the end state of the transition. Features may be generated corresponding to the electrical events, and any classifier known to one of skill in the art may be used to create the transition model, including but not limited to neural networks, self-organizing maps, support vector machines, decision trees, logistic regression, Bayesian models (including naïve Bayes models), random forests, and Gaussian mixture models. A classifier may be trained in this manner for every state change of every device. The classifier may receive the features as input and provide as an output an indication of whether the electrical event corresponds to the state change of the device. Power monitor 150 may store transition models for each possible device state change.

Power monitor 150 may have transition models for state changes of identified devices that have been identified in the home, such as the identified devices of FIG. 3. Power monitor 150 may also have other transition models, such as transition models for identifying new identified devices in the house (e.g., for when a new air conditioner is installed). When an electrical event is identified, power monitor 150 may process features of the electrical event with some or all of the available transition models. Each of the transition models may output a score (e.g., a confidence or a likelihood) indicating a match between the electrical event and the device state change corresponding to the transition model. The transition model scores may be used with the other processing described below to determine the device state change that most likely caused the electrical event.

Some electrical events may correspond to device state changes of devices not in the identified device list of FIG. 3. For example, a transition model may not exist for the device or a new device may have been recently added to the home. In some implementations, one or more additional transition models may be used to identify electrical events that do not correspond to any of the identified devices, such as a universal background model. For example, where a universal background model has a higher score than the other transition models, it may be determined that the electrical event corresponds to an ambiguous device. In some implementations, an entry may be added to an ambiguous device list, such as the list of FIG. 11, that is described in greater detail below.

Figure 9:
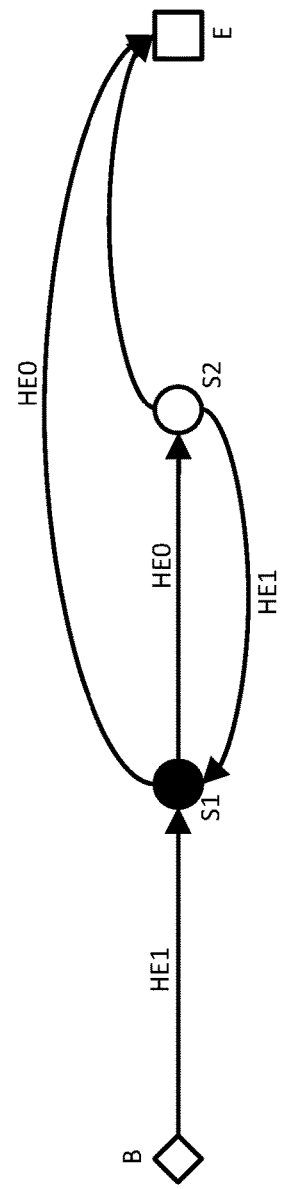
FIG. 9 is an example of a device model that may be used with a power monitor.

Another example of a model is a device model that describes sequential changes to the operation of a device. Any appropriate model may be used for a device model. In some implementations, a directed graph (weighted or unweighted) may be used. In some implementations, a directed graph may allow loops that return to nodes representing particular states. In other implementations, the directed graph may be acyclical, without loops that return to particular nodes. FIG. 9 shows an example of a directed graph with a beginning state denoted "B," an end state denoted "E," and two intermediate states denoted "S1" and "S2." The directed graph of FIG. 9 could correspond to, for example, a burner of an electric stove. When a person turns on the burner of an electric stove, the heating element may not consume power continuously, and may instead consume power in cycles to maintain a desired temperature. In FIG. 9, the transition from state B to state S1 may correspond to the initial activation of the burner. The stove may automatically turn the heating element off to transition from state S1 to state S2, and then back on to transition from state S2 back to state S1. When the person turns off the burner, the graph transitions from state S1 or S2 to state E. In some implementations, the directed graph may also indicate allowable transitions for proceeding from one state to another. For example, in FIG. 9, the transition HE1 (indicating that a heating element is turning on) is an allowable transition from state B to sate S1, and the transition HE0 (indicating that a heating element is turning off) is an allowable transition from state S1 to state S2.

Similarly, other directed graphs may be constructed for other devices. For example, a directed graph may be constructed for the heating elements and pumps of a dishwasher. Further, a dishwasher may have a different directed graph for each operating mode ("light wash," "pot scrubbing," etc.). Simpler devices, such as an incandescent light bulb, may have a very simple device model or may not have a device model at all. Device models may also be created for classes of devices (e.g., dishwashers), classes of devices by a particular manufacturer, specific versions of devices by a particular manufacturer, or specific devices in a home.

Device models may also be used to determine a device state change that caused an electrical event. Some sequences of state changes for a particular device are possible and other sequences are not possible. For example, a light that is already on cannot again be turned on. Suppose an electrical event is processed by the transition models described above, and the highest scoring transition model corresponds to a first light turning on, but this first light was already on as determined by previous processing. Because the device model for the first light indicates that first light cannot transition from the on state to the on state, the combined models may account for this to make a better overall decision. For example, the combined models may instead use a second highest scoring transition model to determine that a second light turned on (especially if the two transition model scores are close to each other) or the combined models may determine that the electrical event corresponds to the first light turning on and that previous processing had made a mistake.

Another example of a model is a wattage model that indicates the expected power usage of a device over time. For example, when turning on a 60-watt incandescent light, it may initially consume 70 watts and transition to 60 watts over time according to an exponential decay at a particular rate. Any appropriate modeling technique may be used to create a wattage model. For example, techniques such as templates, state machines, time-series analysis techniques, Kalman filtering, regression techniques (including autoregressive modeling), and curve fitting may be used.

In some implementations, a template may be used for a wattage model. A template may characterize the expected power use of a device over time, such as over a sequence of time intervals. For example, a template may characterize power usage for a sequence of time intervals after a device is turned on (such as a sequence of intervals to describe a transition period and a last interval to indicate steady state power consumption). In some implementations, a wattage model for a device may be modeled by a Gaussian model (or Gaussian mixture model) with a mean and variance that is determined for each time interval since the device was turned on. In some implementations, the wattage model may also be configured so that the modeling of power usage at one time interval may depend on the actual or estimated power usage from a previous time interval. For example, the wattage model may model the difference between power usage at the current time interval and the previous time interval as another Gaussian distribution with another mean and variance.

Wattage models may also be used to determine a device state change that caused an electrical event. For example, suppose that for an electrical event, a highest scoring transition model corresponds to a first light turning on and the device model for the first light indicates that this is an allowable transition. The wattage model for the first light may indicate that, after turning on, the first light briefly uses 70 W and then transitions to a steady state of 60 W. If the actual change in power consumption caused by the electrical event is 5 W, then the wattage model indicates that the first light did not turn on, and the combined models may make a more accurate decision.

The transition models, device models, and wattage models may be combined in a variety of ways to determine a device state change that caused an electrical event. In some implementations, power monitor 150 may use a search process to classify electrical events. One implementation of a search process is shown in FIG. 10, which includes search graph 1010, electrical event stream 1020, and wattage stream 1030.

Search graph 1010 indicates possible states of devices in the house over time as electrical events are processed. Initially, the graph may contain no nodes or just an initial node, such as N1, corresponding to a first time. Later, nodes N2-N4 may be added to the graph and indicate possible states of devices in the house at a second time later than the first time. Nodes N2-N4 may be connected to Node N1 by edges or arcs to indicate the possible connections over time. There may be some uncertainty as to which of nodes N2-N4 correspond to the actual state of the house and each of the nodes may be associated with a score (such as a likelihood or a probability). Even later, nodes N5-N7 may be added to the graph and indicate possible states of devices in the house at a third time later than the second time. The graph may continue beyond nodes N5-N7 with additional edges and nodes. Of the possible device states shown in search graph 1010, one path through graph may be selected as most likely corresponding to the actual states of the devices in the house.

Node N1 shows an initial or current state of a house as shown by the table connected to node N1, where the table indicates the state of each device in the house. In this example, the house has a stove, a television, and a light bulb. At node N1, the stove is at state B from FIG. 9, the television is in an off state, and the light bulb is off.

Figure 10:
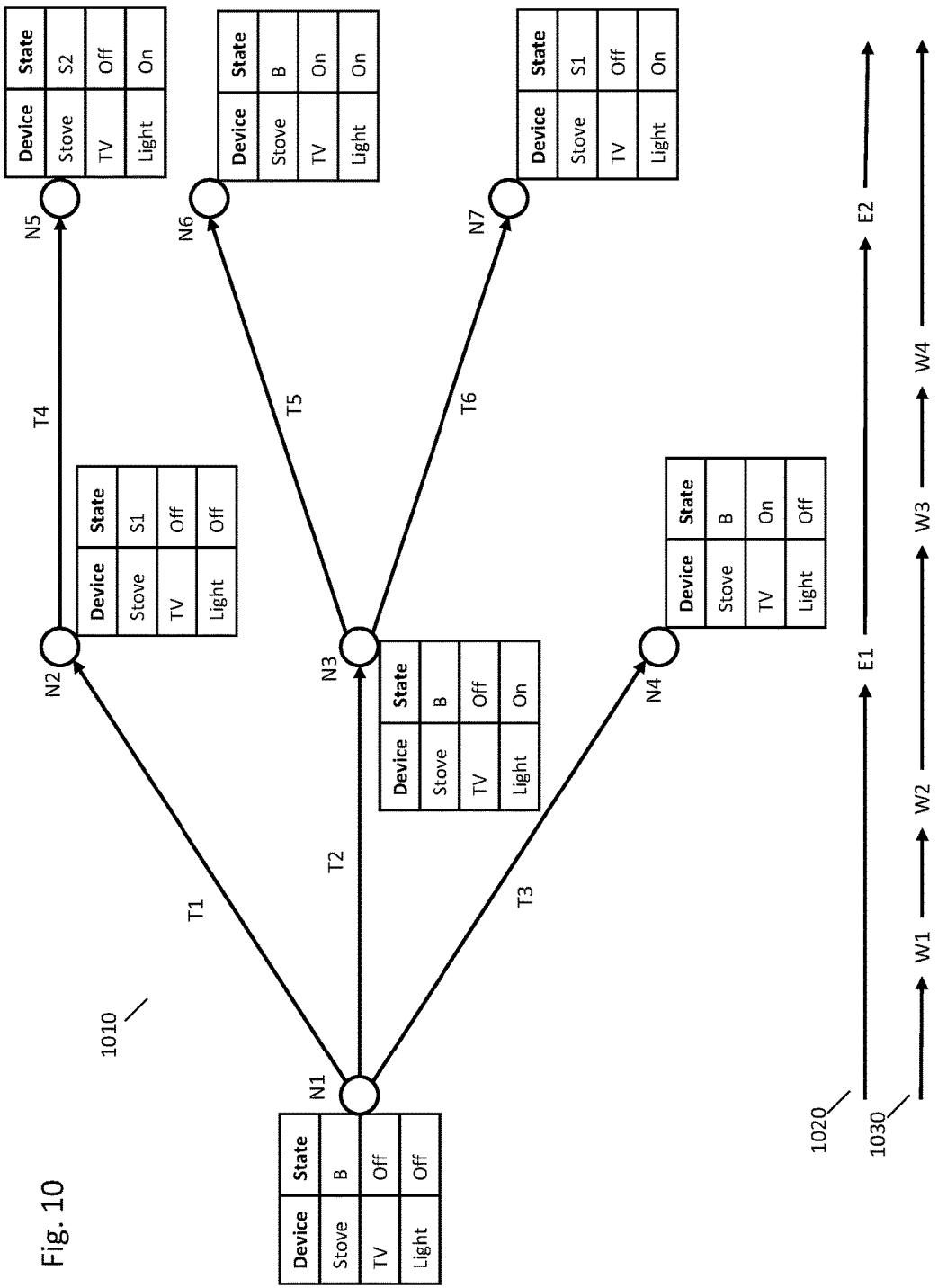
FIG. 10 is an example of a search graph that may be used for determining information about devices in a building.

In FIG. 10, an electrical event stream 1020 is shown beneath the search graph 1010, with electrical events E1 and E2. After electrical event E1 is detected, power monitor 150 processes the electrical event to determine possible state changes to the devices in the house. Nodes N2-N4 in FIG. 10 show possible state changes in response to E1. At node N2, the stove has moved from state B to state S1, at node N3, the light bulb has turned on, and at node N4, the TV has turned on.

After electrical event E2 is detected, power monitor 150 processes the electrical event to determine further possible state changes to the devices in the house. In the example of FIG. 10: node N2 is followed by node N5 where the stove transitions from state S1 to state S2; node N3 is followed by nodes N6 and N7, where N6 corresponds to the light bulb being turned off and N7 corresponds to the stove transitioning from state B to state S1; and no nodes follow node N4. No nodes may be added following node N4 because a score for N4 (discussed in greater detail below) may be low and it is desired to prune this portion of the search graph to save computations. Alternatively, no nodes may be added following node N4, because all of the possible transitions following node N4 have a low score. More generally, any pruning techniques may be used to remove nodes from search graph 1010 to reduce computational complexity. For example, pruning techniques used for pruning speech recognition graphs may also be applied to search graph 1010.

The transitions or nodes of search graph 1010 may each be associated with a search score. The techniques described herein are not limited to use of any particular search score, and any appropriate search score may be used. In some implementations, each node may have a search score, and the search score may indicate a combination of all scores along a path from the beginning (e.g., node N1) to the current node. In some implementations, the search score may be computed using transition models. For example, between N1 and N2, the stove has changed from state B to state S1. Using the transition model for this state change and electrical event E1, a transition score can be computed indicating whether E1 corresponds to this transition. In some implementations, the search score may be determined from a combination of all transition scores along a path to the current node.

In some implementations, the search score may be computed using other models as well, such a device model or a wattage model. For example, for each node that is added to search graph 1010, the search score for that node may be determined by combining a search score for the previous node, a transition score for the current node, and a wattage score for the current node. The search score may be determined from the other scores using any appropriate method. For example, the search score could be the sum, weighted sum, or product of the other scores.

Wattage stream 1030 may include wattage values for the power used by all devices in the house at particular times, such as wattage values W1-W4 indicated in wattage stream 1030. Wattage stream 1030 may include wattage values at regular intervals, such as once per second.

A wattage score for a node may indicate a likelihood that the observed wattage value could be generated by the state of devices hypothesized by that node, and the wattage score may be determined using wattage stream 1030 and wattage models. For example, if templates are used for wattage models as described above, the wattage values may be apportioned to devices that are consuming power by maximizing the joint probability of the Gaussian models for the appropriate time interval of the template. If the wattage values for each device are proportionate to the wattage model for that device, the wattage score will be higher, and if they are not proportionate, the score will be lower. In some implementations, the wattage score may be the joint probability (e.g., according to the Gaussian models from templates) that the devices consumed the apportioned wattage.

For example, consider W1 and W2 in FIG. 10. Before electrical event E1, all the devices are off so W1 and W2 should be approximately 0. After electrical event E1, a single device is now consuming power, and W3 should match, or nearly match, the expected wattage of the device that is consuming power. If W3 is 300 watts, then it may be more likely that the stove turned on, as opposed to concluding that a 60-watt light bulb turning on. After event E2, there may be two devices consuming power, and a pair of devices whose expected sum of wattages is close to the total will achieve a higher score than a pair of devices whose sum is not close.

Different techniques are available for selecting the nodes to follow an existing node in the search graph. In some implementations, all possible transitions are always added to the search graph. While this increases the computational complexity, it may also increase the accuracy of the search. In other implementations, only a subset of possible transitions will be added to the search graph. For example, the transitions corresponding to the three highest search scores may be added, or all transitions with search scores higher than a threshold may be added. In some implementations, only valid transitions may be added to the search graph (e.g., you cannot turn on a television that is already on).

A current best path through the graph may be used to determine the states of devices in the house. For example, after adding nodes N5-N7 to the graph, it may be determined that the path from node N1 to N3 to N7 may be highest scoring path through the path, and a device list, such as the device list of FIG. 3 may be updated to reflect the states indicated by node N7.

As time goes on, more nodes may be added to the search graph and a new best path may be selected. In some implementations, a new best path may override a previous best path and, in effect, change that past. For example, a node N8 may be added after node N6 and the new best path may be from node N1 to N3 to N6 to N8. Accordingly, a previous decision at node N7 that stove was turned on may be determined to be incorrect and replaced with the decision at node N6 that the television turned on.

Accordingly, as time goes on, additional electrical events may be detected, a search graph may be updated by adding nodes for possible state transitions, a best path through the search graph may be determined, and the current state of devices may be updated in a device list, such as the device list of FIG. 3.

Storing Device State Changes

Each electrical event may be classified as corresponding to a state change of an identified device or as not corresponding to a state change of any identified devices. The results of the classification may be stored for further processing, such as to determine power consumption of devices or groups of devices.

Where an electrical event is classified as corresponding to a state change of an identified device, information about the electrical event may be stored in a list of identified devices, such as the list of FIG. 3. Any appropriate information about the electrical event and/or the identified device corresponding to the electrical event may be stored. For example, the current state of the identified device, a previous state of the identified device, a date and time of the most recent state change, or historical information about state changes of the identified device (e.g., information about state changes over the previous 7 days).

Where an electrical event is classified as not corresponding to a state change of any identified devices, information about the electrical event may be stored in a list of ambiguous devices, such as the list of FIG. 11. For example, an entry may be added to a list of ambiguous devices that includes a date and time of the electrical event, a power change corresponding to the electrical event (e.g., a measure of the difference in power consumption before and after the electrical event).

The information about identified devices and ambiguous devices may be stored in any appropriate format. For example, in some implementations, information about identified devices and ambiguous devices may be stored in a single list or table.

Many variations are possible for storing information about state changes of ambiguous devices. In some implementations, a state change of an ambiguous device may correspond only to one of two state changes—an ambiguous device turning on or an ambiguous device turning off. For example, where the state change causes an increase in power consumption, it may be presumed that an ambiguous device transitioned from an off state to an on state, and where the state change causes a decrease in power consumption, it may be presumed that an ambiguous device transitioned from an on state to an off state.

In some implementations, an ambiguous device may be added to the list of ambiguous devices when it corresponds to an ambiguous device turning on and the ambiguous device may be later removed from the list when it is determined that the same ambiguous device turned off. For example, where an electrical event corresponds to an ambiguous device turning off, the off state change may be compared to each of the ambiguous devices on the ambiguous device list (including information about the on state change for each of the ambiguous devices) to determine a best match between the off state change and each of the ambiguous devices on the list. When an ambiguous device is added to the list of ambiguous devices, information about the on state change may be stored in the list to facilitate matching with a later off state change.

Any appropriate techniques may be used to determine a best match between an off state change and the ambiguous devices on the list. In some implementations, a power change of the off state change may be compared with the power change for each of the of the on state changes. In some implementations, features may be computed for each of the on state changes and the off state change (such as the features described above and/or a power change of the state change), and a classifier (e.g., a support vector machine or a neural network) may be used to determine a closest match between the off state change and the on state changes. An ambiguous device that best matches the off state change may be selected, and this selected ambiguous device may be removed from the list. The features for an on state change of an ambiguous device may also be stored in list of ambiguous devices, such as in the feature_blob shown in FIG. 11, where a blob encompasses any format of storing data.

In some implementations, an ambiguous device may remain on the list of ambiguous devices after it is determined that the ambiguous device turned off (e.g., by matching an off state change with an on state change as described above). Where an ambiguous device remains on the list of ambiguous devices, a state of each ambiguous device (e.g., on or off) may be stored in the list.

Where an ambiguous device remains on the ambiguous device list after it turns off, additional information or statistics about the ambiguous device may also be stored. For example, features relating to on state changes, features relating to off state changes, and a history of state changes (e.g., dates and times) may be stored, such as in the statistics_blob of FIG. 11. This information and statistics may be used, for example, to improve the matching of an off state change with an on state change.

In some implementations, variations of the techniques described above may also be applied to classifying ambiguous devices. For example, an ambiguous device may have its state updated as part of the beam search described above or as part of a separate beam search.

Power Consumption Determination

In addition to determining the states of devices, an amount of power consumption of individual devices (e.g., identified devices) and groups of devices may be determined. Power consumption of devices and groups of devices may be determined over a sequence of time intervals as indicated above. For each time interval, a total amount of power consumption for each time interval may be determined from the one or more power monitoring signals, and the techniques described herein may be used to determine power consumption for individual devices and groups of devices.

Some devices in a home may be always on, such as computer networking equipment or a television that is in a low power state. These always-on devices may consume a relatively constant amount of power, and this always-on power consumption may be computed using any appropriate techniques. In some implementations, the always-on power consumption may be determined as the minimum power consumption over a recent time interval, such as the last 24 hours or the last week. In some implementations, the always-on power consumption may remove outliers when determining the minimum power consumption over a time period. For example, where there is an electrical outage, the minimum power consumption would go to zero, but this would not reflect the typical minimum power consumption of the house. The always-on power consumption may be updated at regular intervals (likely less frequent intervals, such as daily or weekly), but when determining real-time power consumption of a building, such as every second, the always-on power consumption may generally be constant.

Power consumption may be determined for each identified device at each time interval. In some implementations, the power consumption for an identified device may be determined from power changes caused by state changes of the identified device. For example, when an identified device is off, it may be presumed that it is computing no (or a negligible amount) of power. When the identified device turns on, as determined by processing an electrical event, a power change corresponding to the electrical event may be attributed to the identified device. The power change may be determined by comparing an average power consumption over a window before the electrical event with an average power consumption over a window after the electrical event. The power consumption of the identified device may otherwise be considered to be constant. For example, where a light turns on at a first time with a power change of 60 W, the light may have zero power consumption before the first time and a power consumption of 60 W after the first time until the light is turned off. A similar procedure may be applied to identified devices with more than two states. For each state change of an identified device, the power consumption of the identified device may be modified based on the power change of the corresponding electrical event.

In some implementations, power consumption for an identified device may be determined using a wattage model for each state change of the identified device. In some implementations, a wattage model may include a template. A template may indicate the expected power consumption of the identified device for a sequence of time intervals after the state change. For example, for a 60 W light turning on, the template may indicate that the light is expected to consume a specified amount of power for the first 10 time intervals after the state change (e.g., 72 W, 69 W, 67 W, 65 W, 64 W, 63 W, 62 W, 62 W, 61 W, and 61 W) and then consume 60 W of power until the light is turned off. Templates can similarly be used for each state change of each identified device. A template for a state change may be created using examples of power monitoring signals corresponding to the state change, such as by computing an average for each time interval.

In some implementations, a wattage model may be a generalization of a template, where each time interval has a mean or expected value of power consumption and a corresponding variance. When apportioning an amount of power to identified devices, the amount of power may be apportioned using the means and variances, such as using a maximum likelihood algorithm.

Power consumption may also be determined for each ambiguous device at each time interval. For ambiguous devices, templates or wattage models may not be available to determine an amount of energy consumption. In some implementations, the only information available to determine an amount of power consumption of an ambiguous device may be the power monitoring signal. To determine an amount of power consumption for an ambiguous device, a change in power consumption from the ambiguous device changing from an off state to an on state (e.g., as determined using a window of the power monitoring signal before the electrical event and a window of the power monitoring signal after the electrical event, as described above) may be determined, and the ambiguous device may be presumed to have a constant amount of power consumption while it is on. The total amount of power consumption of ambiguous devices may be combined to determine the power consumption for the "other" category as described above.

Where statistics are collected about ambiguous devices, these statistics may be used to determine an amount of power consumption for an ambiguous device. For example, each time an ambiguous device turns on, the power consumption of the device may be recorded as indicated above. The power consumption of an ambiguous device may then be determined using these statistics, such as by computing an average of previous power consumption of the ambiguous device.

In some implementations, it may be desired to ensure that, for a time interval, the sum of the power consumption for each identified device, the group of other devices, and the group of always-on devices is equal to the total amount of power consumed. Any appropriate techniques may be used to modify power consumption values so that they correctly sum to the total amount of power consumption.

In some implementations, the amount of power consumption for each device or group may be multiplied by a factor. For example, if the sum of power consumption of each device and group sums to 1.1 times the actual power consumption, the power consumption of each device and group may be multiplied by 0.9. In some implementations, only some power values may be modified. For example, where the sum of power consumption of each device and group is 23 W greater than the total power consumption, then power consumption of the other group may be reduced by 23 W.

In some implementations, the power consumption of the other group or the group of ambiguous devices may be broken down into categories, such as the categories described above, to provide the user with useful information about power consumption corresponding to the group. An electrical event corresponding to an ambiguous device may be classified to determine a probability or a score of the electrical event corresponding to each of the possible categories.

In some implementations, features may be computed for an electrical event corresponding to a state change of an ambiguous device. These features may be processed by a classifier (such as a support vector machine or a neural network) to output a vector of scores or probabilities, where each element of the vector corresponds to a category and indicates a match between the electrical event and the category. The power change corresponding to the electrical event may then be attributed to a highest scoring category.

In some implementations, statistics of previous state changes of the ambiguous device may be used to categorize the ambiguous device. For example, some ambiguous devices may have less frequent state changes (e.g., charging an electric car) and some ambiguous devices may have more frequent state changes (e.g., cycling of heating or cooling devices). The statistics of previous state changes may also be input into the classifier described above.

When attributing the power change of the electrical event to a category, either a hard decision or a soft decision may be used. With a hard decision, all of the power change corresponding to the electrical event may be assigned to the highest scoring category. With a soft decision, the power change corresponding to the electrical event may be attributed to multiple categories (e.g., the two highest scoring categories) or all of the categories in proportion to the classifier scores. This process may be repeated for each time interval to obtain category power consumption as illustrated by FIG. 5 and FIG. 6.

The classifiers for categorizing electrical events may be determined by any appropriate techniques. In some implementations, the classifier may be trained by collecting training data corresponding to known electrical events for each of the categories. A classifier may then be trained using the training data and techniques known to one of skill in the art.
Implementation The above techniques may be combined to allow a power monitor to identify electrical events, classify them as corresponding to identified devices or ambiguous devices, and continuously update power consumption of identified devices, groups of devices, and/or categories of devices.

Figure 12:
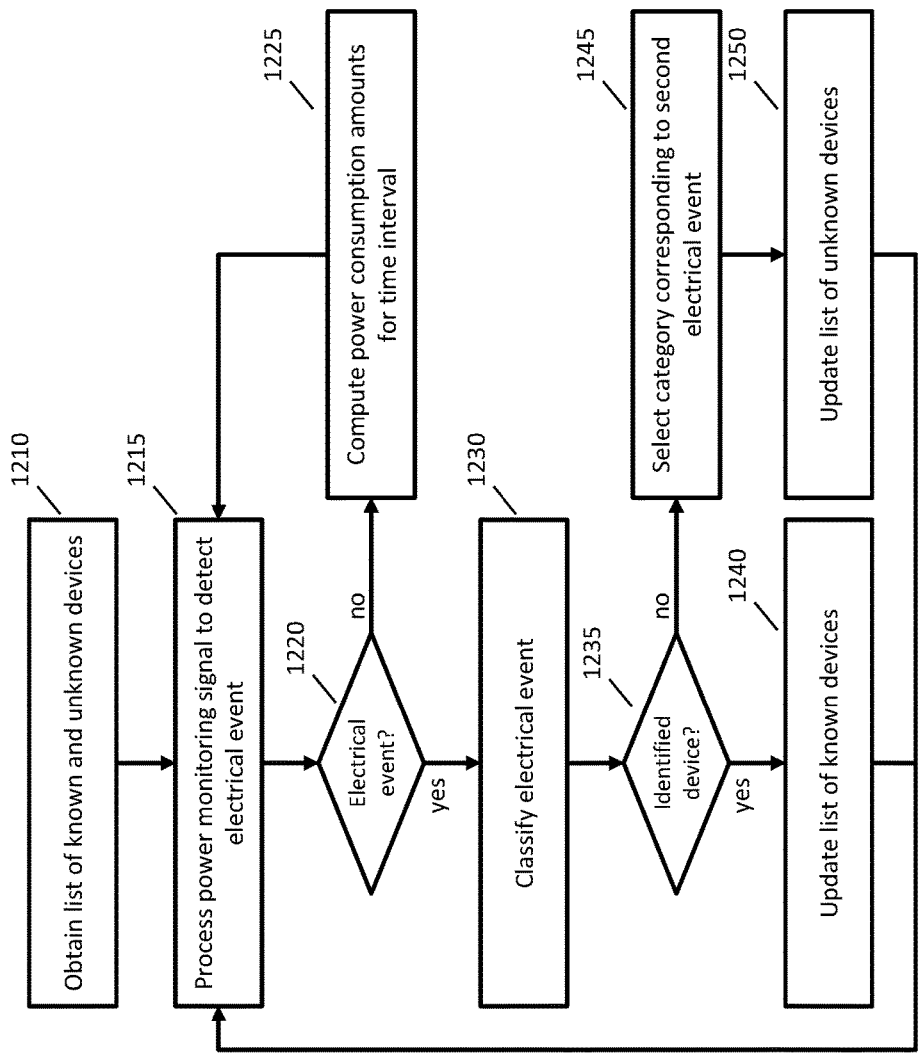
FIG. 12 is a flowchart showing an example implementation determining power consumption information about devices in a building.

FIG. 12 is a flowchart illustrating an example implementation of this processing. In FIG. 12, the ordering of the steps is exemplary and other orders are possible, not all steps are required and, in some implementations, some steps may be omitted or other steps may be added. The process of the flowcharts may be implemented, for example, by any of the computers or systems described herein.

At step 1210, a list of identified devices and a list of ambiguous devices is obtained. These lists may be part of a single list or may be different lists. The lists may be stored in any appropriate format, such as a database table. The lists may be initialized as empty lists, and during the processing below, devices may be added to one or both lists (e.g., using techniques described in U.S. Pat. No. 9,443,195). Models or classifiers may also be obtained for identified devices or for other devices, such as any of the models or classifiers described above.

At step 1215, a power monitoring signal is processed to identify or detect if an electrical event corresponding to a state change of a device is present, such as by using any of the techniques described above. At step 1220, if an electrical event is not detected, then processing proceeds to step 1225 where power consumption values are computed for a time interval (e.g., every second). The power consumption values for the time interval may by computed for each identified device, a group of other or ambiguous devices, a group of always-on devices, for each category of devices, and any other appropriate device or group of devices. After step 1225, processing proceeds to step 1215 to again process the power monitoring signal to determine if an electrical event is present.

At step 1220, if an electrical event is present, then processing proceeds to step 1230 where the electrical event is classified, such as to determine whether the electrical event corresponds to a state change of an identified device or does not correspond to a state change of any identified device. Any appropriate techniques may be used to classify the electrical event, such as computing features from the electrical event, processing the features with a model or classifier, and outputting a vector of scores indicating a match between the electrical event and the state changes of the identified devices. For example, the classifier may include a transition model for each state change of each identified device where the transition model indicates a match between an electrical event and a state change of an identified device.

At step 1235, if the electrical event corresponds to a state change of an identified device, then processing proceeds to step 1240 to update the list of identified devices with information about the state change determined by the classifier at step 1235. For example, where the state change corresponds to a light turning on, the state of the light may be updated in the list of identified devices and optionally with other information relating to the electrical event or the state change, such as a time of the state change, a change in power consumption, or features computed from the electrical event.

At step 1235, if the electrical event does not correspond to a state change of an identified device, then the state change corresponds to an ambiguous device and processing proceeds to step 1245. At step 1245, one or more categories of devices are selected as corresponding to the ambiguous device. For example, a hard decision or a soft decision may be made to associate the ambiguous device with one or more categories. In some implementations, step 1245 is only performed where the state change corresponds to an ambiguous device turning on, or step 1245 may not be performed at all and ambiguous devices may not be classified.

At step 1250, a list of ambiguous devices is updated using information about the state change. Where the state change corresponds to an ambiguous device turning on, the ambiguous device may be added to the list of ambiguous devices or an entry for the ambiguous device may already be present in the list, and this entry may be updated. Where the state change corresponds to an ambiguous device turning off, the state change may be matched with an existing device on the list of ambiguous devices, using any of the techniques described above. The matching entry for the ambiguous device may then be removed from the list or updated. Any of the information described above may be included in the list of ambiguous devices.

After step 1240 or step 1250, processing may proceed back to step 1215 where the power monitoring signal is again processed to detect an electrical event. The processing of FIG. 12 may run continuously so that a user is able to receive information about devices in the home at any time.

At any point in the processing of FIG. 12, information about devices may be transmitted to a server for storage and/or further processing. For example, the information transmitted to the server may include the states of devices at regular intervals, the power consumption of devices or groups of devices at regular intervals, or information about state changes (e.g., time of the state change and a change in the amount of power consumption). For example, information about devices may be transmitted to a server in real time or may be transmitted in batches at regular time intervals, such as once every five minutes or once an hour. The server may transmit the information about devices to a user device for presentation to a user or may further process the information before transmitting to a user device. For example, the server may receive information at one second intervals, and may process the information to provide information to the user at other intervals, such as hourly or daily intervals.

Other variations are possible for the processing of FIG. 12. For example, in some implementations, portions of the processing of FIG. 12 may be performed in parallel. For example, the processing of the power monitoring signal to detect and classify electrical events may be performed in a first thread of processing, the computation of the power consumption for devices and groups of devices at regular time intervals may be performed by a second thread of processing, and the transmission of device information to the server may be performed by a third thread of processing. In some implementations, the processing to compute the power consumption for devices and groups of devices may be performed less frequently. For example, the power consumption processing may be performed once per minute, and at each minute, power consumption may be determined at one second intervals since the previous minute.

Figure 13:
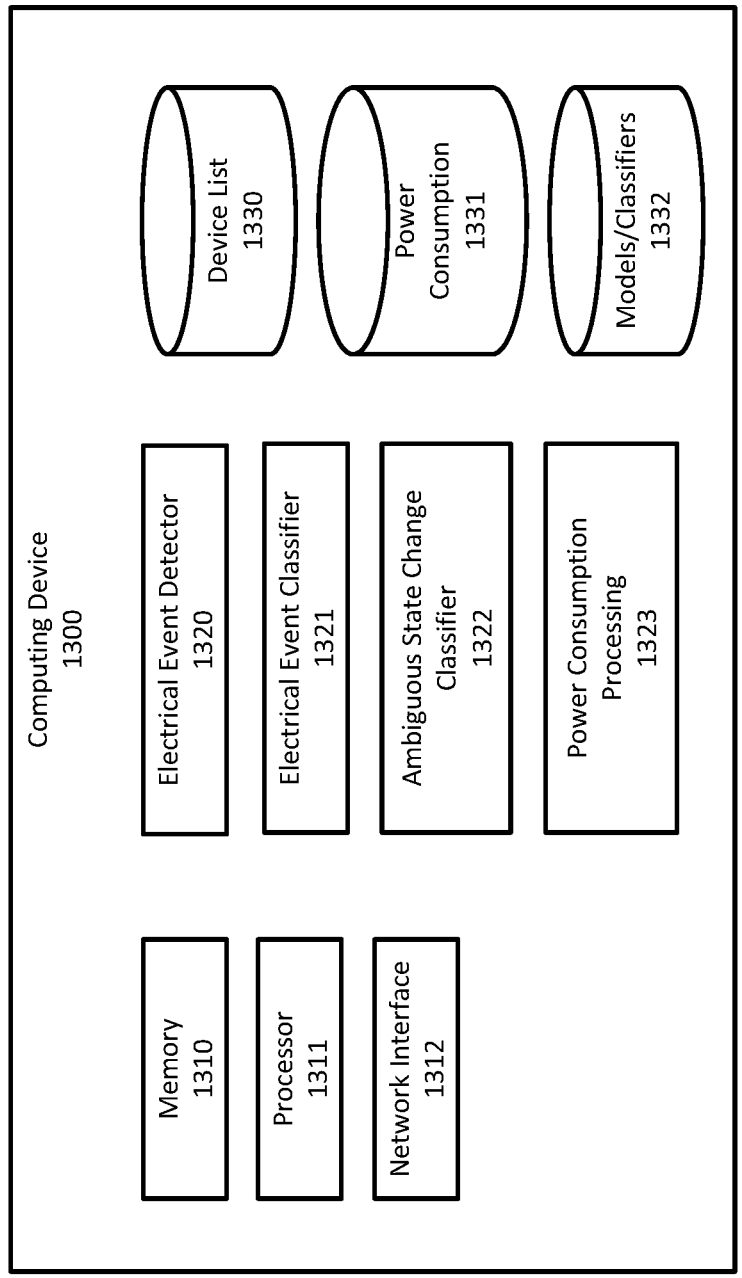
FIG. 13 is an example of a device for determining power consumption information about devices in a building.

FIG. 13 illustrates components of one implementation of a computing device 1300 that may be used for any of a power monitor or a server that operates in conjunction with a power monitor. In FIG. 13, the components are shown as being on a single computing device, but the components may be distributed among multiple computing devices, such as among any of the devices mentioned above or among several server computing devices.

Computing device 1300 may include any components typical of a computing device, such as one or more processors 1311, volatile or nonvolatile memory 1310, and one or more network interfaces 1312 for connecting to computer networks. Computing device 1300 may also include any input and output components, such as displays, keyboards, and touch screens. Computing device 1300 may also include a variety of components or modules providing specific functionality, and these components or modules may be implemented in software, hardware, or a combination thereof. Below, several examples of components are described for one example implementation, and other implementations may include additional components or exclude some of the components described below.

Computing device 1300 may include an electrical event detector component 1320 that may be used to process power monitoring signals and determine if an electrical event is present in a portion of the power monitoring signal. Computing device 1300 may include an electrical event classifier component 1321 that may be used to process features of an electrical event and determine a state change of an identified device that best matches the electrical event or determine that the electrical event does not match a state change of any identified device. Computing device 1300 may include an ambiguous state change classifier component that may be used to identify one or more categories corresponding to a state change of an ambiguous device. Computing device 1300 may include a power consumption processing component 1323 that determines an amount of power consumption of individual devices and groups of devices for a sequence of time intervals.

Computing device 1300 may include or have access to various data stores, such as data stores 1330, 1331, and 1332. Data stores may use any known storage technology such as files or relational or non-relational databases. For example, computing device 1300 may have a device list data store 1330 to record information about devices, such as an identified device list and an ambiguous device list. Computing device 1300 may have a power consumption data store 1331 to store information about power consumption for individual devices and groups of devices for a sequence of time intervals. Computing device 1300 may have a models/classifiers data store 1332 that may be used to store any of the models or classifiers described herein.

While only a few embodiments of the present invention have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The processor may be part of a server, cloud server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, cloud server, client, firewall, gateway, hub, router, or other such computer and/or networking hardware. The software program may be associated with a server that may include a file server, print server, domain server, internet server, intranet server and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer to peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another, such as from usage data to a normalized usage dataset.

The elements described and depicted herein, including in flow charts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

All documents referenced herein are hereby incorporated by reference.

What is claimed is:

1. A system for providing information about devices in a building, the system comprising one or more devices, each comprising at least one processor and at least one memory, configured to:
   obtain a first classifier, wherein the classifier processes an electrical event to generate scores indicating a match between the electrical event and state changes of a plurality of identified devices;
   obtain a power monitoring signal corresponding to a measurement of a power line to the building;
   identify a first electrical event in the power monitoring signal, wherein the first electrical event corresponds to a state change of a device;
   determine that the first electrical event corresponds to a first state change of a first identified device by processing the power monitoring signal with the first classifier;
   update a list of identified devices using the first state change of the first identified device;
   identify a second electrical event in the power monitoring signal, wherein the second electrical event corresponds to a state change of a device;
   determine that the second electrical event corresponds to an ambiguous device by processing the power monitoring signal with the first classifier, wherein the ambiguous device is not in the plurality of identified devices;
   select one or more categories from a plurality of categories as corresponding to the second electrical event by processing the electrical event with a second classifier;
   add an entry to a list of ambiguous devices corresponding to the second electrical event, wherein the entry comprises information about a change in power consumption caused by the second electrical event and information about the one or more categories corresponding to the electrical event;
   compute an amount of power consumption for a sequence of time intervals for each identified device of the plurality of identified devices using the list of identified devices and one or more wattage models;
   compute an amount of power consumption for the sequence of time intervals for each category of the plurality of categories using the list of ambiguous devices; and
   transmit device information to a user device for presentation to a user, wherein the device information comprises (i) information about power consumption of the plurality of identified devices and (ii) information about power consumption of the plurality of categories of ambiguous devices.

2. The system of claim 1, wherein the system comprises:
   a power monitor installed in the building and comprising at least one processor and at least one memory; and
   one or more servers, each comprising at least one processor and at least one memory.

3. The system of claim 2, wherein the power monitor is configured to:
   compute the amount of power consumption for the sequence of time intervals for each identified device of the plurality of identified devices; and
   compute the amount of power consumption for the sequence of time intervals for each category of the plurality of categories of ambiguous devices.

4. The system of claim 1, wherein the one or more devices are configured to:
   compute an amount of power consumption for a group of devices that are always on; and
   transmit to a user device for presentation to a user information about power consumption for the group of devices that are always on.

5. The system of claim 1, wherein the device information transmitted to the user device corresponds to an amount of power consumption over a time period.

6. The system of claim 5, wherein the time period is a second, a minute, an hour, a day, a week, or a month.

7. The system of claim 1, wherein the device information is transmitted to the user device in real time.

8. A method for providing information about devices in a building, the method comprising:
   obtaining a first classifier, wherein the classifier processes an electrical event to generate scores indicating a match between the electrical event and state changes of a plurality of identified devices;
   obtaining a power monitoring signal corresponding to a measurement of a power line to the building;
   identifying a first electrical event in the power monitoring signal, wherein the first electrical event corresponds to a state change of a device;
   determining that the first electrical event corresponds to a first state change of a first identified device by processing the power monitoring signal with the first classifier;
   updating a list of identified devices using the first state change of the first identified device;

identifying a second electrical event in the power monitoring signal, wherein the second electrical event corresponds to a state change of a device;

determining that the second electrical event corresponds to an ambiguous device by processing the power monitoring signal with the first classifier, wherein the ambiguous device is not in the plurality of identified devices;

selecting one or more categories from a plurality of categories as corresponding to the second electrical event by processing the electrical event with a second classifier;

adding an entry to a list of ambiguous devices corresponding to the second electrical event, wherein the entry comprises information about a change in power consumption caused by the second electrical event and information about the one or more categories corresponding to the electrical event;

computing an amount of power consumption for a sequence of time intervals for each identified device of the plurality of identified devices using the list of identified devices and one or more wattage models;

computing an amount of power consumption for the sequence of time intervals for each category of the plurality of categories using the list of ambiguous devices; and transmitting device information to a server, wherein the device information comprises (i) information about power consumption of the plurality of identified devices and (ii) information about power consumption of the plurality of categories of ambiguous devices.

9. The method of claim 8, comprising:
determining a first amount of power consumption before the second electrical event;
determining a second amount of power consumption after the second electrical event; and
determining the information about the change in power consumption caused by the second electrical event using the first amount of power consumption and the second amount of power consumption.

10. The method of claim 9, wherein the device information comprises states of the plurality of identified devices.

11. The method of claim 9, comprising:
determining that the first electrical event corresponds to the first state change of the first identified device by adding one or more nodes to a graph corresponding to the first electrical event and performing a beam search on the graph.

12. The method of claim 9, comprising:
determining that the second electrical event corresponds to the ambiguous device transitioning from an off state to an on state;
identifying a third electrical event in the power monitoring signal, wherein the third electrical event corresponds to a state change of a device;
determining that the third electrical event corresponds to the ambiguous device transitioning from the on state to the off state; and
removing the entry for the ambiguous device from the list of ambiguous devices.

13. The method of claim 12, comprising:
determining that the third electrical event corresponds to the ambiguous device transitioning from the on state to the off state by comparing features of the second electrical event with features of the third electrical event.

14. The method of claim 9, wherein the entry for the ambiguous device comprises statistics of previous state changes of the ambiguous device.

15. The method of claim 14, wherein selecting one or more categories corresponding to the second electrical event comprises using the statistics of previous state changes of the ambiguous device.

16. The method of claim 9, wherein the entry for the ambiguous device comprises one or more categories corresponding to the ambiguous device, a time of the second electrical event, or features computed from the second electrical event.

17. The method of claim 9, further comprising converting the ambiguous device to an identified device using statistics of state changes of the ambiguous device.

18. One or more non-transitory computer-readable media comprising computer executable instructions that, when executed, cause at least one processor to perform actions comprising:

obtaining a first classifier, wherein the classifier processes an electrical event to generate scores indicating a match between the electrical event and state changes of a plurality of identified devices;

obtaining a power monitoring signal corresponding to a measurement of a power line to a building;

identifying a first electrical event in the power monitoring signal, wherein the first electrical event corresponds to a state change of a device;

determining that the first electrical event corresponds to a first state change of a first identified device by processing the power monitoring signal with the first classifier;

updating a list of identified devices using the first state change of the first identified device;

identifying a second electrical event in the power monitoring signal, wherein the second electrical event corresponds to a state change of a device;

determining that the second electrical event corresponds to an ambiguous device by processing the power monitoring signal with the first classifier, wherein the ambiguous device is not in the plurality of identified devices;

selecting one or more categories from a plurality of categories as corresponding to the second electrical event by processing the electrical event with a second classifier;

adding an entry to a list of ambiguous devices corresponding to the second electrical event, wherein the entry comprises information about a change in power consumption caused by the second electrical event and information about the one or more categories corresponding to the electrical event;

computing an amount of power consumption for a sequence of time intervals for each identified device of the plurality of identified devices using the list of identified devices and one or more wattage models;

computing an amount of power consumption for the sequence of time intervals for each category of the plurality of categories using the list of ambiguous devices; and transmitting device information to a server, wherein the device information comprises (i) information about power consumption of the plurality of identified devices and (ii) information about power consumption of the plurality of categories of ambiguous devices.

19. The one or more non-transitory computer-readable media of claim 18, wherein the power monitoring signal indicates a current or voltage of the power line.

20. The one or more non-transitory computer-readable media of claim 18, wherein the one or more categories comprise lighting, electronics, heating, cooling, laundry, kitchen, cooking, refrigerators, freezers, pumps, small appliances, or electric vehicles.

21. The one or more non-transitory computer-readable media of claim 18, wherein the classifier comprises a plurality of transition models.

\* \* \* \* \*